United States Patent
Hou et al.

(10) Patent No.: US 7,279,945 B2
(45) Date of Patent: Oct. 9, 2007

(54) HIGH RESOLUTION PHASE LOCKED LOOP

(75) Inventors: Kuen-Suey Hou, Taipei (TW); Jin-Bin Yang, Chang-Hua Hsien (TW)

(73) Assignee: Mediatek Incorporation, Hsin-Chu Hsien (TW)

(*) Notice: Subject to any disclaimer, the term of this patent is extended or adjusted under 35 U.S.C. 154(b) by 36 days.

(21) Appl. No.: 10/710,894

(22) Filed: Aug. 11, 2004

(65) Prior Publication Data
US 2005/0168254 A1  Aug. 4, 2005

(30) Foreign Application Priority Data
Jan. 29, 2004 (TW) .............................. 93102048 A

(51) Int. Cl.
*H03L 7/06* (2006.01)

(52) U.S. Cl. ........................ 327/156; 327/147

(58) Field of Classification Search ............... None
See application file for complete search history.

(56) References Cited

U.S. PATENT DOCUMENTS

| | | | | |
|---|---|---|---|---|
| 4,908,810 A | * | 3/1990 | Oie | 369/47.4 |
| 5,337,335 A | | 8/1994 | Cloetens et al. | 375/376 |
| 5,889,418 A | * | 3/1999 | Kim | 327/47 |
| 6,147,530 A | * | 11/2000 | Nogawa | 327/156 |
| 6,150,888 A | * | 11/2000 | Nakazawa | 331/11 |
| 6,331,792 B1 | * | 12/2001 | Tonietto | 327/48 |

\* cited by examiner

*Primary Examiner*—Quan Tra
*Assistant Examiner*—Khareem E. Almo
(74) *Attorney, Agent, or Firm*—Winston Hsu

(57) ABSTRACT

A phase locked loop (PLL) generates a phase locked signal and adjusts a frequency of the phase locked signal according to an incoming signal. The PLL includes an oscillator for generating the phased locked signal and a frequency detection module electrically coupled to the oscillator. The frequency detection module includes a pattern detector for detecting the two regular patterns in the incoming signal, a counter electrically coupled to the pattern detector for calculating the number of periods of the phase locked signal corresponding to the distance between the two regular patterns, and a comparator electrically coupled to the counter for comparing the number of periods with a predetermined value to generate a control signal, and using the control signal to control the oscillator to adjust the frequency of the phase locked loop signal.

8 Claims, 3 Drawing Sheets

HIGH RESOLUTION PHASE LOCKED LOOP

BACKGROUND

The invention relates to phase locked loops (PLLs), and more particularly, to detecting a distance between two regular patterns in an incoming signal, and according to the detected distance, adjusting the frequency of a phase locked signal in a PLL.

Phase locked loops (PLLs) are a key component in signal processing systems and have a primary function of producing a phase locked signal that has a bit rate and phase matched to an incoming signal. This phase locked signal allows the signal processing system to perform operations such as recovering data from the incoming signal.

In optical storage devices, PLLs play a critical role. Please refer to FIG. 1. FIG. 1 shows a block diagram of a PLL 100 used in an optical storage device according to the related art. The PLL 100 includes a frequency detector (FD) 110, a phase detector (PD) 120, an integrator 130, an adder 140, and a voltage controller oscillator (VCO) 150. As shown in FIG. 1, the PLL 100 receives an incoming signal that is an eight to fourteen modulation (EFM) signal, and the PLL 100 generates an outgoing phase locked signal being an EFM_CLOCK signal. The FD 110 and the PD 120 compare the incoming EFM signal with the outgoing EFM_CLOCK signal, and the VCO 150 is controlled according to the results of these comparisons. In this way, the generated EFM_CLOCK signal has a bit rate and a phase that is matched to the incoming EFM signal.

However, in practical implementations, a compromise exists between a pull-in range and a phase error of the PD 120. In order to obtain an acceptable phase error, the pull-in range of the PD 120 is often limited. This limited pull-in range is a problem because, in some situations, although the FD 110 is unable to detect a frequency deviation between the EFM signal and the EFM_CLOCK signal, the EFM_CLOCK signal may still be outside the pull-in range of the PD 120. Therefore, in these situations, the PD 120 is unable to adjust the phase of the EFM_CLOCK signal to match that of the incoming EFM signal. In order to solve this problem, related art optical storage devices further include some specialized circuits to expand the frequency response of the PLL 100 and use other frequency offset information to drive the VCO 150 and thereby adjust the frequency of the EFM_CLOCK signal to enter the pull-in range of the PD 120.

Using compact discs (CDs) as an example, the EFM signal recorded on CDs has a feature that a legal run length (i.e., the distance between two changes in signal state) is limited to between 3T and 11T, where T refers to the fundamental period of the EFM signal. Any runs less than or equal to 2T, or greater than or equal to 12T are classified as illegal run-lengths. In an optical storage device according to the related art, the PLL 100 uses these illegal run-lengths to obtain additional frequency offset information. For example, using the EFM_CLOCK signal as a reference, if the EFM signal is detected to have run lengths less than 2T, this means the frequency of the EFM_CLOCK signal is less than the bit rate of the EFM signal. Therefore, the PLL 100 increases the frequency of the EFM_CLOCK. Conversely, using the EFM_CLOCK signal as a reference, if the EFM signal is detected to have run lengths greater than 12T, this means the frequency of the EFM_CLOCK signal is greater than the bit rate of the EFM signal. Therefore, the PLL 100 decreases the frequency of the EFM_CLOCK.

There are several problems with using the above described illegal run lengths to generate this extra frequency offset information. Firstly, even if the frequency of the EFM_CLOCK signal is correct, illegal run lengths may still occur in the EFM signal. For example, illegal run lengths can occur if the optical disc read by the optical disc device is scratched or if the burning process used to record information on the optical disc was not perfect. In order to prevent the PLL 100 from mistakenly adjusting the frequency of the EFM_CLOCK signal, protective measures to prevent unnecessary adjustments must be taken.

Secondly, the above described method of using the illegal run lengths is not able to provide the PLL 100 with frequency offset information regarding smaller frequency differences. For example, a normal EFM signal having 11T must be misjudged as having 12T before the EFM signal will be regarded as having an illegal run length. Concerning the accuracy of the frequency control, this resolution is not optimal.

Disclosed in U.S. Pat. No. 5,337,335 is a PLL capable of providing extra frequency offset information. However, the disclosed PLL still uses illegal run lengths in a received EFM signal and therefore includes the above-mentioned two problems.

SUMMARY

One objective of the claimed invention is therefore to provide a phase locked loop (PLL), to solve the above-mentioned problems.

According to an exemplary embodiment of the claimed invention, a phase locked loop (PLL) is disclosed for generating a phase locked signal and adjusting a frequency of the phase locked signal according to an incoming signal. The PLL comprises an oscillator for generating the phased locked signal; and a frequency detection module electrically coupled to the oscillator for detecting two regular patterns in the incoming signal, calculating a number of periods of the phase locked signal corresponding to a distance between the two regular patterns, and controlling the oscillator to adjust the frequency of the phase locked loop signal according to the number of periods.

According to another exemplary embodiment of the claimed invention, a method is disclosed for producing a phase locked signal and adjusting a frequency of the phase locked signal according to an incoming signal. The method comprises the following steps: (a) producing the phase locked signal; (b) detecting two regular patterns in the incoming signal; (c) calculating a number of periods of the phase locked signal corresponding to a distance between the two regular patterns; and (d) adjusting the frequency of the phase locked signal according to the number of periods.

These and other objectives of the claimed invention will no doubt become obvious to those of ordinary skill in the art after reading the following detailed description of the preferred embodiment that is illustrated in the various figures and drawings.

DETAILED DESCRIPTION

In actuality, in order to allow for the function of synchronization, at intervals of a fixed distance there will be a fixed pattern. Using the EFM signal of a CD as an example, every 588 bits constitutes a frame, and the first 24 bits in each frame form a sync pattern having a fixed pattern. When measuring the distance between sync patterns in the EFM signal using the EFM_CLOCK having a correct frequency as a base, the correct measured value should be 588 (i.e., 588 EFM_CLOCK periods). However, if the frequency of the EFM_CLOCK signal is too fast, the measured distance will be greater than 588. Conversely, if the frequency of the EFM_CLOCK signal is too slow, the measured distance will be less than 588. The present invention uses this principle to provide PLL frequency offset information.

Figure 1:
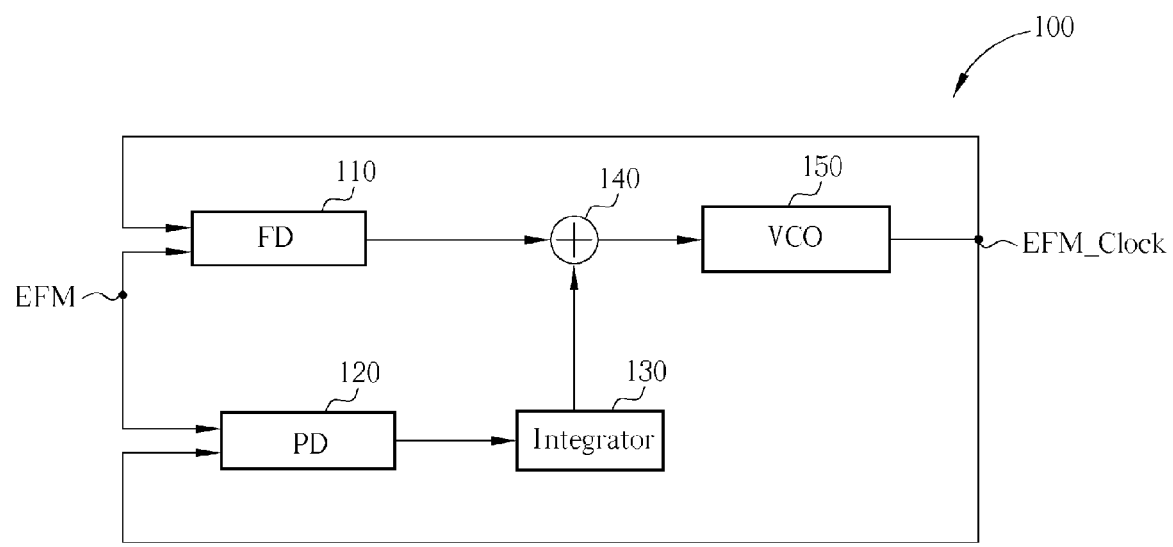
FIG. 1 is a block diagram of a PLL used in an optical storage device according to the related art.
Figure 2:
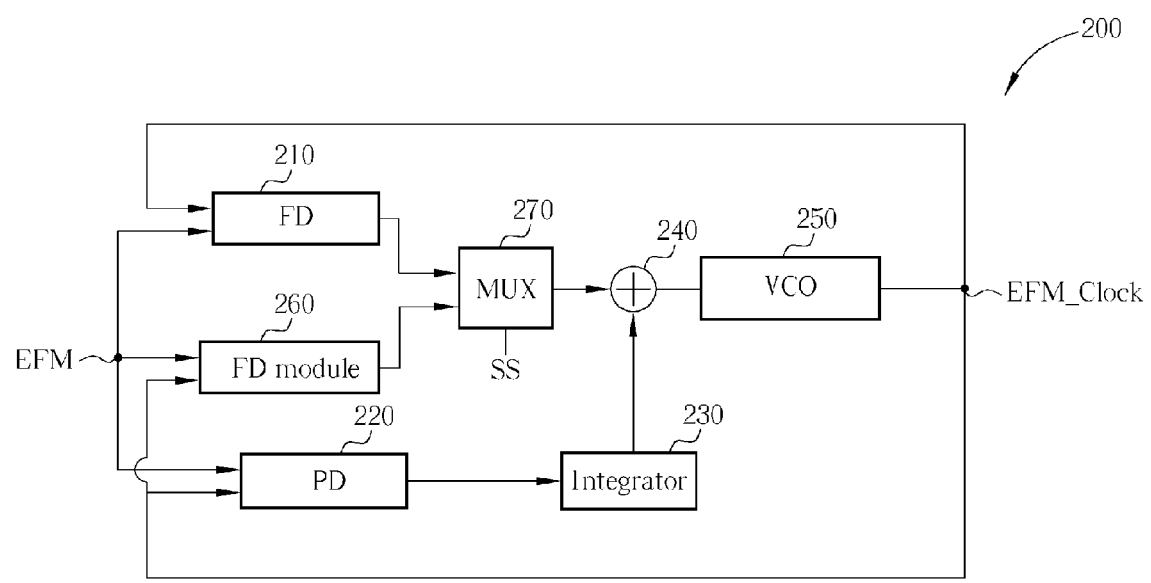
FIG. 2 is a block diagram of a PLL according to an exemplary embodiment of the present invention.

Please refer to FIG. 2. FIG. 2 shows a block diagram of a PLL 200 according to an exemplary embodiment of the present invention. In this embodiment, the PLL 200 includes a frequency detector (FD) 210, a phase detector (PD) 220, an integrator 230, an adder 240, a voltage controller oscillator (VCO) 250, a frequency detecting module 260, and a multiplexer 270. In FIG. 2, the FD 210 and the PD 220 can have substantially the same structure and function with the related art FD 110 and PD 120; however, the present invention is not limited to this configuration. For example, the VCO 250 could be replaced with a numerical controlled oscillator or a current controlled oscillator.

The frequency detecting module 260 allows the EFM_CLOCK signal generated by the VCO 250 to be used as a base when measuring the distance between two regular patterns in the EFM signal (e.g., by using a number of EFM_CLOCK periods N). The VCO 250 is controlled to adjust the frequency of the EFM_CLOCK signal according to the number of periods N.

Figure 3:
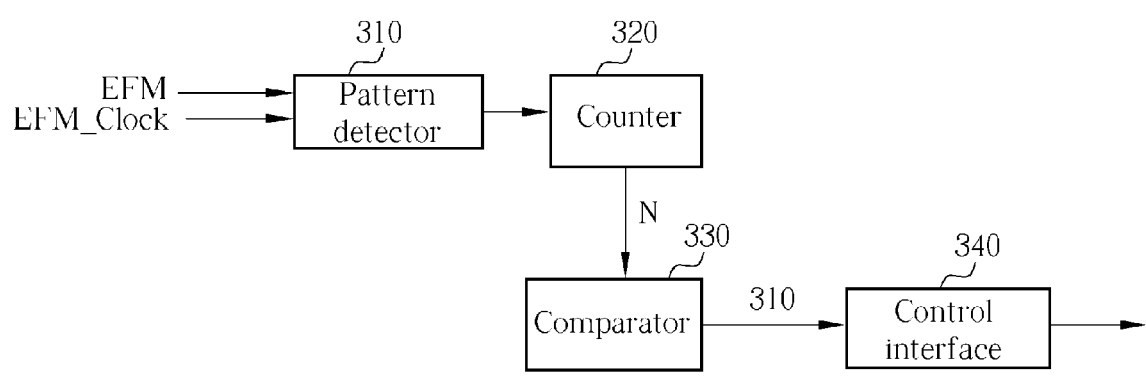
FIG. 3 is a block diagram of an implementation of the frequency detection module of FIG. 2 according to an exemplary embodiment of the present invention.

Please refer to FIG. 3. FIG. 3 shows a block diagram of an implementation of the frequency detection module 260 according to an exemplary embodiment of the present invention. The frequency detection module 260 includes a pattern detector 310 used to detect two regular patterns of the EFM signal. In one embodiment, the two regular patterns are respective sync patterns from two adjacent frames. In another embodiment, the two regular patterns are respective sync patterns from two non-adjacent frames. (The further the distance between the two regular patterns, the higher the resolution of the system, however, the longer the time required to obtain the frequency offset information.) A counter 320 is electrically coupled to the pattern detector 310 for counting the number of period N of the EFM_CLOCK signal between the two regular patterns. A comparator 330 is electrically coupled to the counter 320 for comparing the number of periods N with a predetermined value (or with a plurality of predetermined values) to produce a control signal. Additionally, a control interface is electrically coupled to the comparator 330 for controlling the VCO 250 to adjust the frequency of the EFM_CLOCK signal according to the control signal. Using a value of 588 as the predetermined value as an example, if the number of periods N is less than 588 (e.g., N=587), the comparator 330 uses the control signal, via the control interface 340, to control the VCO 250 to increase the frequency of the EFM_CLOCK signal. Conversely, if the number of periods N is greater than 588 (e.g., N=589), the comparator 330 uses the control signal, via the control interface 340, to control the VCO 250 to decrease the frequency of the EFM_CLOCK signal.

In the embodiment shown in FIG. 2, the FD 210 and the frequency detection module 260 are both electrically coupled to the multiplexer 270, which makes a selection between the two according to a selection signal SS. In this embodiment, the selection signal SS is a timeout signal. That is, if the FD 210 has not changed for a predetermined time period and the PLL 200 has not yet entered a locked state, the system will switch the selection signal SS to use the frequency detection module 260.

It is an advantage of the present invention that frequency offset information is provided having a high resolution. For example, by using the disclosed apparatus of the present invention, if the measured distance between the sync patterns of the EFM signal changes from 588 to 589 (or 587), the system will determine the frequency of the EFM_CLOCK to be in error. This is in contrast to the related art, which uses illegal run lengths to obtain frequency offset information. More specifically, only when a run length of 11T becomes 12T (or when a run length of 3T becomes 2T) will the related art systems judge the frequency of the EFM_CLOCK signal to be in error. The resolution of the related art is much lower than the resolution of the present invention.

Please note, although the above description uses an EFM signal corresponding to a CD as an example, as long as the incoming signal has regular patterns appearing at a fixed distance from one another, the PLL according to the present invention can be used to ensure the bit rate and phase of the generated phase locked signal matches that of the incoming signal.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A phase locked loop (PLL) generating a phase locked signal and adjusting a frequency of the phase locked signal according to an incoming signal having periodic frames, the PLL comprising:

an oscillator for generating the phased locked signal;

a frequency detection module electrically coupled to the oscillator for detecting two regular patterns within two different frames of the incoming signal, calculating a number of periods of the phase locked signal corresponding to a distance between the two regular patterns, and controlling the oscillator to adjust the frequency of the phase locked loop signal according to the number of periods;

a frequency detector for calculating a difference in frequency between the incoming signal and the phase locked loop signal, and further for controlling the oscillator to adjust the frequency of the phase locked loop signal according to the difference in frequency; and a multiplexor coupled to the frequency detector, the frequency detection module, and the oscillator, the multiplexor for selecting one of the frequency detector or the frequency detection module to control the oscillator to adjust the frequency of the phase locked loop signal;

wherein the multiplexor first selects the frequency detector to control the oscillator to adjust the frequency of the phase locked loop signal, and then selects the frequency detection module to control the oscillator to adjust the frequency of the phase locked loop signal if the PLL has not entered into a locked state after a predetermined time.

2. The PLL of claim 1, wherein the frequency detection module comprises:
   a pattern detector for detecting the two regular patterns in the incoming signal;
   a counter electrically coupled to the pattern detector for calculating the number of periods of the phase locked signal corresponding to the distance between the two regular patterns; and
   a comparator electrically coupled to the counter for comparing the number of periods with a predetermined value to generate a control signal, and using the control signal to control the oscillator to adjust the frequency of the phase locked signal.

3. The PLL of claim 2, wherein if the number of periods is less than the predetermined value, the comparator uses the control signal to control the oscillator to increase the frequency of the phase locked signal; and if the number of periods is greater than the predetermined value, the comparator uses the control signal to control the oscillator to decrease the frequency of the phase locked signal.

4. The PLL of claim 2, wherein the frequency detection module further comprises a control interface electrically coupled to the comparator for controlling the oscillator to adjust the frequency of the phase locked signal according to the control signal.

5. The PLL of claim 1, wherein the incoming signal is a modulation signal and the two regular patterns are sync patterns of the modulation signal.

6. The PLL of claim 1, wherein the oscillator is a numerical controlled oscillator or a current controlled oscillator.

7. The PLL of claim 1 wherein the two different frames are non-adjacent frames.

8. The PLL of claim 1, wherein the oscillator is a numerical controlled oscillator.

* * * * *